United States Patent
Alers et al.

(10) Patent No.: US 8,278,216 B1
(45) Date of Patent: Oct. 2, 2012

(54) SELECTIVE CAPPING OF COPPER

(75) Inventors: Glenn Alers, Scotts Valley, CA (US);
Nerissa Draeger, Fremont, CA (US);
Michael Carolus, Milpitas, CA (US);
Julie Carolus, legal representative, Pasadena, TX (US)

(73) Assignee: Novellus Systems, Inc., San Jose, CA (US)

( * ) Notice: Subject to any disclaimer, the term of this patent is extended or adjusted under 35 U.S.C. 154(b) by 852 days.

(21) Appl. No.: 11/506,761

(22) Filed: Aug. 18, 2006

(51) Int. Cl.
*H01L 21/44* (2006.01)

(52) U.S. Cl. . 438/681; 438/674; 438/680; 257/E21.586; 257/E21.171

(58) Field of Classification Search ............... 438/681, 438/674, 676, 680; 257/E21.586, E21.171
See application file for complete search history.

(56) References Cited

U.S. PATENT DOCUMENTS

| | | | |
|---|---|---|---|
| 5,695,810 A | 12/1997 | Dubin et al. | |
| 6,153,519 A * | 11/2000 | Jain et al. | 438/681 |
| 6,323,131 B1 | 11/2001 | Obeng et al. | |
| 6,342,733 B1 | 1/2002 | Hu et al. | |
| 6,753,248 B1 * | 6/2004 | Wood et al. | 438/627 |
| 6,844,258 B1 | 1/2005 | Fair et al. | |
| 6,899,816 B2 | 5/2005 | Padhi et al. | |
| 7,157,798 B1 | 1/2007 | Fair et al. | |
| 7,256,466 B2 | 8/2007 | Lieber et al. | |
| 7,994,640 B1 | 8/2011 | Alers et al. | |
| 8,039,379 B1 | 10/2011 | Alers et al. | |
| 2003/0082587 A1 | 5/2003 | Seul et al. | |
| 2004/0105934 A1 | 6/2004 | Chang et al. | |
| 2004/0127001 A1 | 7/2004 | Colburn et al. | |
| 2004/0175631 A1 | 9/2004 | Crocker et al. | |
| 2005/0119725 A1 | 6/2005 | Wang et al. | |
| 2005/0129843 A1 | 6/2005 | Wu et al. | |
| 2006/0108320 A1 | 5/2006 | Lazovsky et al. | |
| 2006/0113675 A1 * | 6/2006 | Chang et al. | 257/763 |
| 2006/0118921 A1 * | 6/2006 | Lin et al. | 257/637 |
| 2006/0189113 A1 | 8/2006 | Vanheusden et al. | |
| 2006/0254503 A1 | 11/2006 | Dai et al. | |
| 2006/0254504 A1 | 11/2006 | Dai et al. | |
| 2006/0292846 A1 | 12/2006 | Pinto et al. | |
| 2007/0134420 A1 | 6/2007 | Koberstein et al. | |

(Continued)

FOREIGN PATENT DOCUMENTS

WO 2006/124769 11/2006

OTHER PUBLICATIONS

Tsai, et al., "Metalorganic chemical vapor deposition of tungsten nitride for advanced metallization", Appl. Phys. Lett. 68 (10), Mar. 4, 1996, pp. 1412-1414.

(Continued)

*Primary Examiner* — Leonard Chang
(74) *Attorney, Agent, or Firm* — Weaver Austin Villeneuve & Sampson LLP

(57) ABSTRACT

The present invention provides methods of selectively depositing refractory metal and metal nitride cap layers onto copper lines inlaid in a dielectric layer. The methods result in formation of a cap layer on the copper lines without significant formation on the surrounding dielectric material. The methods typically involve exposing the copper lines to a nitrogen-containing organo-metallic precursor and a reducing agent under conditions that the metal or metal nitride layer is selectively deposited. In a particular embodiment, an amino-containing tungsten precursor is used to deposit a tungsten nitride layer. Deposition methods such as CVD or ALD may be used.

16 Claims, 8 Drawing Sheets

U.S. PATENT DOCUMENTS

2008/0067679 A1 3/2008 Takagi et al.

OTHER PUBLICATIONS

Becker et al., "Highly Conformal Thin Films of Tungsten Nitride Prepared by Atomic Layer Deposition from a Novel Precursor", Chem. Mater. 2003, 15, 2969-2976.

Chiu et al., "Tungsten nitride thin films prepared by MOCVD", J. Mater. Res., vol. 8, No. 6, Jun. 1993, pp. 1353-1360.

Crane et al., "Kinetic and Mechanistic Studies of the Chemical Vapor Deposition of Tungsten Nitride from Bis (Tertbutylimido) Bis (Tertbutylamido) Tungsten", J. Phys. Chem. B 2001, 105, 3549-3556.

Wu et al., Surface reaction of bis (tertbutylimido) bis (diethylamido) tungsten precursor on Si(100)—(2X1), J. Vac. Sci. Technol. A 21(5), Sep./Oct. 2003, pp. 1620-1624.

Kim et al., "Characteristics of Tungsten Carbide Films Prepared by Plasma-Assisted ALD Using Bis(tert-butylimido)bis(dimethylamido) tungsten", Journal of the Electrochemical Society, 150 (10) C740-C744 (2003).

Becker et al., "Diffusion barrier properties of tungsten nitride films grown by atomic layer deposition from bis (tert-butylimido)bis(dimethylamido) tungsten and ammonia", Applied Physics Letters, vol. 82, No. 14, Apr. 7, 2003, pp. 2239-2241.

U.S. Appl. No. 12/044,918, "Selective Capping of Copper with Ruthenium", Alers et al., filed Mar. 7, 2008.

U.S. Appl. No. 10/984,126, Office Action mailed Nov. 23, 2005.

U.S. Appl. No. 10/984,126, Office Action mailed May 17, 2006.

U.S. Appl. No. 10/984,126, Notice of Allowance mailed Aug. 25, 2006.

U.S. Appl. No. 10/984,126, Allowed Claims.

U.S. Appl. No. 11/772,767, "Nanoparticle Cap Layer", Alers et al., filed Jul. 2, 2007.

U.S. Appl. No. 11/772,773, "Nanoparticle Cap Layer", Alers et al., filed Jul. 2, 2007.

U.S. Appl. No. 11/772,784, "Nanoparticle Cap Layer", Alers et al., filed Jul. 2, 2007.

Cheng, Guangjun et al., "Magnetic-Field-Induced Assemblies of Cobalt Nanoparticles", Langmuir The ACS Journal of Surfaces and Colloids, American Chemical Society, Dec. 20, 2005, vol. 21, No. 26.

Lee, Don Keun et al., "Preparation of monodisperse Co and Fe nanoparticle using precursor of $M^{2+}$-oleate$_2$ (M=Co, Fe)", Current Applied Physics 6 (2006) 786-790, Jun. 17, 2004.

Chen, Wei et al., "Carbene-Functionalized Ruthenium Nanoparticles", Chem. Mater. 2006, 18, 5253-5259, Jul. 11, 2006.

Chen, Shaowei et al., "Electrochemical Quantized Capacitance Charging of Surface Ensembles of Gold Nanoparticles", J. Phys. Chem. B 1999, 103, 9996-10000, Jul. 29, 1999.

Cao, L.F. et al., "Thermal stability of Fe, Co, Ni metal nanoparticles", phys. Stat. sol. (b) 243, No. 12, 2745-2755 (2006), Jan. 9, 2006.

Zimmerman, C.G. et al., "Burrowing of Co Nanoparticles on Clean Cu and Ag Surfaces", Physical Review Letters, The American Physical Society, vol. 83, No. 6, Aug. 9, 1999.

Chirea, M. et al., "Electrochemical Characterization of Polyelectrolyte/Gold Nanoparticle Multilayers Self-Assembled on Gold Electrodes", J. Phys. Chem. B 2005, 109, 21808-21817, Jul. 9, 2005.

Hu, C.K. et al., "Atom motion of Cu and Co in Cu damascene lines with a CoWP cap", Applied Physics Letters, American Institute of Physics, vol. 84, No. 24, Jun. 14, 2004.

Parod-Yissar, V. et al., "Layered Polyelectrolyte Films on Au Electrodes: Characterization of Electron-Transfer Features at the Charged Polymer Interface and Application for Selective Redox Reactions", Langmuir 2001, 17, 1110-1118, May 30, 2000, American Chemical Society.

U.S. Appl. No. 12/044,918,918, Office Action mailed Jun. 22, 2009.

Kwon, Oh-Kyum et al., "PEALD of a Ruthenium Adhesion Layer for Copper Interconnects", Journal of The Electrochemical Society, 151 (12) C753-C756 (2004).

ALOHA Electronics, Aloha CVD/ALD Materials.

U.S. Appl. No. 11/772,784, Office Action mailed Aug. 28, 2009.

U.S. Appl. No. 12/044,918, Office Action mailed Jan. 25, 2010.

U.S. Appl. No. 11/772,767, Office Action mailed Sep. 22, 2010.

U.S. Appl. No. 11/772,784, Office Action mailed Feb. 23, 2010.

U.S. Appl. No. 11/772,773, Office Action mailed Sep. 29, 2010.

U.S. Appl. No. 11/772,773, Office Action mailed Jan. 11, 2011.

U.S. Appl. No. 11/772,784, Notice of Allowance mailed Dec. 28, 2010.

U.S. Appl. No. 11/772,784, Allowed Claims as of Dec. 28, 2010.

U.S. Appl. No. 11/772,767, Office Action mailed Apr. 12, 2011.

U.S. Appl. No. 11/772,773, Final Office Action mailed Jul. 26, 2011.

U.S. Appl. No. 11/772,767, Notice of Allowance mailed Jun. 27, 2011.

Allowed Claims as of Jun. 27, 2011, U.S. Appl. No. 11/772,767.

Gladfelter, Wayne L., "Selective Metallization by Chemical Vapor Deposition," Chem. Mater., 1993, vol. 5, pp. 1372-1388.

* cited by examiner

SELECTIVE CAPPING OF COPPER

FIELD OF THE INVENTION

This invention pertains to methods for creating metal and metal nitride capping layers over copper lines on a semiconductor device so as to prevent electromigration of the copper line and diffusion of copper into substrate material.

BACKGROUND OF THE INVENTION

Because copper has a lower resistivity and higher resistance to electromigration compared to aluminum, it has become the preferred material for creating conductive lines in high performance integrated circuits. Since Cu does not readily form volatile compounds and is therefore difficult to dry etch, the fabrication of Cu interconnects requires a damascene approach, whereby a metal is deposited into a recess etched in an insulating material (dielectric) and then planarized using chemical mechanical polish (CMP). While the damascene concept is straightforward and has been used for centuries in jewelry making, etc., the fabrication of damascene Cu interconnects in integrated circuits is a challenging task due to problems associated with Cu integration.

One integration issue is that Cu can readily diffuse into surrounding oxide-like or polymeric dielectric materials when subjected to high temperatures of subsequent fabrication processes. Diffusion of Cu into the surrounding insulating dielectric will lead to line-to-line leakages and eventual device failure. So it is necessary to fully enclose Cu lines with diffusion barriers. FIG. 1 illustrates a cross section of a part of a damascene device in which a Cu line 101 is encapsulated by metal diffusion barriers 105, typically made of tantalum, tantalum nitride or combination thereof, between the Cu and surrounding dielectric material 107. In addition, a dielectric capping layer 103 is deposited between the Cu line 101 and dielectric 109 to avoid electrical shorting of adjacent metal lines and to complete the Cu encapsulation. The dielectric capping layer material is typically silicon nitride because of its ability to block Cu diffusion and resist the dielectric etches used to define subsequent vias to the overlying metal level. Prior to deposition of the dielectric capping layer, the copper oxide that has formed on the surface of the Cu (Cu readily oxidizes when exposed to water or air) must be removed by chemical reduction to promote adhesion and optimize device reliability.

Another integration issue when using Cu as the primary conductor in devices is electromigration. Electromigration redistributes the Cu in the line, and the resulting extrusions can expand into the dielectric space. In general, electromigration occurs when the metal atoms of conductive lines are subjected to electric fields while the circuit is in operation. The metal atoms will redistribute in the direction of the electron flow to form voids (areas lacking metal material) and extrusions (protrusions of metal material outside of the metal or dielectric barrier) along the length of the metal lines. For example, this is illustrated in damascene device of FIG. 1. A void 111 has formed at the silicon nitride/Cu interface, causing the Cu buildup and formation of an extrusion 113 to downstream of the electron flow in the Cu line 101. Voids will cause the Cu line to thin and eventually separate completely, causing an open circuit. Extrusions can cause the Cu metal to extend past the Cu line into an adjacent Cu line, thereby causing a short circuit.

Although silicon nitride as a capping layer material is effective in blocking Cu diffusion, there are some problems of using a silicon nitride capping layer, especially related to the electromigration issues described above. For example, it has been observed that voids caused by electromigration are observed most frequently at the edges of the Cu lines at the silicon nitride/Cu interface. This is likely partly due to the poor adhesion between silicon nitride and Cu. Furthermore, once a void is formed, the area around the void will experience increased electron flux, causing even more pronounced electromigration and acceleration of the degradation process. Another issue with using silicon nitride as a capping layer is that silicon nitride has a relatively high dielectric constant. This means that when a layer of silicon nitride is directly on top of and adjacent to the Cu conductive lines, there is an increase in overall capacitance between the conductive lines, which increases the RC time delay.

Because of the problems associated with using silicon nitride, others have proposed using other materials for capping Cu lines such as tungsten. One reason for this is because tungsten adheres well to Cu. In addition, tungsten has a relatively low resistivity compared to silicon nitride.

There are other integration issues, however, associated with using tungsten and other refractory metals for capping of Cu lines. Since a refractory metal is more conductive than silicon nitride, it must be selectively deposited over copper lines with minimal coverage over the insulating regions of the device. It is also important that the refractory metal be deposited conformally and particle-free so that there is good contact between Cu and the capping layer. This uniform and selective deposition of a refractory metal can be difficult to achieve. In many processes, the film does not selectively deposit on copper but deposits on dielectric as well. Electroless deposition of cobalt has also been evaluated for selective deposition on copper. However, full coverage of dense versus isolated copper lines may be a problem with electroless deposition.

What is therefore needed is a process for forming a selective metal or metal nitride capping layer that obviates these and other problems.

SUMMARY OF THE INVENTION

The present invention meets these needs by providing methods of selectively depositing refractory metal and metal nitride cap layers onto copper lines inlaid in a dielectric layer. The methods result in formation of a cap layer on the copper lines without significant formation on the surrounding dielectric material. The methods typically involve exposing the copper lines to a nitrogen-containing organo-metallic precursor and a reducing agent under conditions that the metal or metal nitride layer is selectively deposited. In a particular embodiment, an amino-containing tungsten precursor is used to deposit a tungsten nitride layer. Deposition methods such as CVD or ALD may be used.

One aspect of the invention relates to methods of forming a metal nitride capping layer on copper lines of a semiconductor device. The method involves providing a partially fabricated semiconductor device having exposed surfaces of the copper lines and surrounding dielectric to a reactor; introducing a nitrogen-containing organo-metallic precursor and a reducing agent to the reactor; and exposing the partially fabricated semiconductor device to the organo-metallic precursor and reducing agent under conditions such that the metal nitride is selectively deposited on the exposed copper lines. Selectively deposition on the exposed copper lines involves deposition on the copper lines without significant deposition on the surrounding dielectric.

Films such as tungsten nitride and tantalum nitride films may be selectively deposited in this manner to form capping layers. Precursors and reaction conditions must be chosen so that the metal nitride film deposits on the exposed copper lines without significantly depositing on the surrounding dielectric. According to various embodiments, suitable precursors include bis(alkylimido)bis(alkylamido)tungsten precursors, e.g., bis(tert-butylimido)bis(dimethylamido)tungsten, for the deposition of tungsten nitride, and tert-butylimino tris(diethylamino) tantalum ("TBTDET") and pentakis di-methyl amino tantalum ("PDMAT") for the deposition of tantalum nitride.

Another aspect of the invention relates to formation of capping layers by selectively depositing metal layers on copper lines. The methods involve providing a partially fabricated semiconductor device comprising exposed surfaces of the copper lines and surrounding dielectric to a reactor; introducing an organo-metallic precursor and a reducing agent to the reactor; and exposing the partially fabricated semiconductor device to the organo-metallic precursor and reducing agent under conditions such that a metal film is selectively deposited on the exposed copper lines. According to various embodiments, the organo-metallic precursor is selected from bis(N,N' di-isopropyl acetamidinato) cobalt (II), (2,4-dimethylpentadienyl)(ethylcyclopentadienyl)ruthenium, and ethylcyclopentadienyl methylcyclopentadienyl ruthenium.

Also in various embodiments, the methods of the invention first reduce copper oxide on the exposed copper lines prior to metal or metal nitride deposition. The methods may employ hydrogen gas at suitable chamber conditions to reduce the Cu oxide to Cu metal. Alternatively, the method may reduce the copper oxide using a mixture of hydrogen gas and one or both of argon or nitrogen gas. Alternatively, the method may employ a reducing agent such as $SiH_4$, $Si_2H_6$ or $B_2H_6$. The Cu surface may be cleaned prior to being reduced by using either hydrogen plasma, dry etching or wet cleaning.

DETAILED DESCRIPTION OF THE PREFERRED EMBODIMENTS

Introduction

Figure 1:
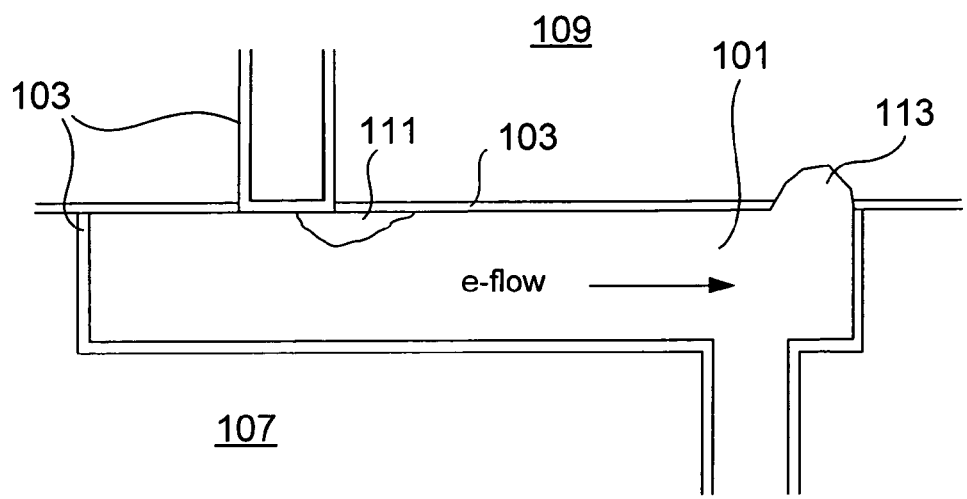
FIG. 1 is a schematic illustration of part of a damascene structure in a semiconductor device showing a void in a copper line caused by electromigration.

The present invention relates to metal and metal nitride capping layers made of refractory metals selectively deposited on copper conductive paths. Refractory metals such as tungsten, tantalum, ruthenium and cobalt are used. As indicated above, conventional processes use silicon nitride capping layers. Voids caused by electromigration are observed most frequently at the edges of the Cu lines at the silicon nitride/Cu interface. This is likely partly due to the poor adhesion between silicon nitride and Cu. Use of refractory metals for capping layers improves adhesion, reduces void formation and improves device reliability. Generally, refractory metals have high melting points and bond strongly to copper. Refractory metal and metal nitride cap layers on copper conductive paths improve adhesion between copper and the dielectric overlying dielectric, provide a shunting path for current and decrease line-to-line leakages. However, since a refractory metal is more conductive than silicon nitride, it must be selectively deposited over copper lines with minimal coverage over the insulating regions of the device.

The present invention provides metal and metal nitride capping layers on copper lines of a partially fabricated integrated circuit. The capping layers of the present invention are made of materials such as tungsten nitride, tantalum nitride, cobalt and ruthenium. The methods described herein involve selectively depositing metal or metal nitride layer on exposed copper inlaid in dielectric material. The methods involve reacting a metal or metal nitride precursor with a reducing agent to form the capping layer.

In certain embodiments, the methods of the present invention involve forming a capping layer by reacting an organo-metallic precursor with a reducing agent to selectively deposit a metal layer on the copper lines. The metal layer may be used as the capping layer or nitrided to convert all or part of it to a metal nitride layer.

In some embodiments, the methods of the present invention involve depositing a metal nitride layer by reacting a nitrogen-containing organo-metallic precursor with a reducing agent. This may be advantageous over depositing a metal layer which is then used as a capping layer as described above, for several reasons. First, although a metal cap can be effective for preventing electromigration at the silicon nitride interface, in some cases it is still possible for Cu to diffuse or migrate through a metal barrier. Using a metal nitride cap (e.g., a $WN_x$ layer rather than W layer) improves the barrier qualities of the capping layer. Second, the need for a subsequent nitridation operation is eliminated as the layer as deposited is a metal nitride. In addition, the entire layer is a metal nitride layer, rather than just an upper portion.

The methods of the present invention also provide full coverage of dense and isolated lines. Full coverage for electroless deposition processes, for example, may be difficult, Selectivity for electroless depends critically on the condition of the copper/dielectric surface, but proper cleaning and preparation of the surface is difficult with a wet process. This affects coverage. The CVD and ALD processes of the present invention, however, can include hydrogen reduction operations to remove corrosion inhibitors and prepare the copper surface for selective deposition.

Figure 2A:
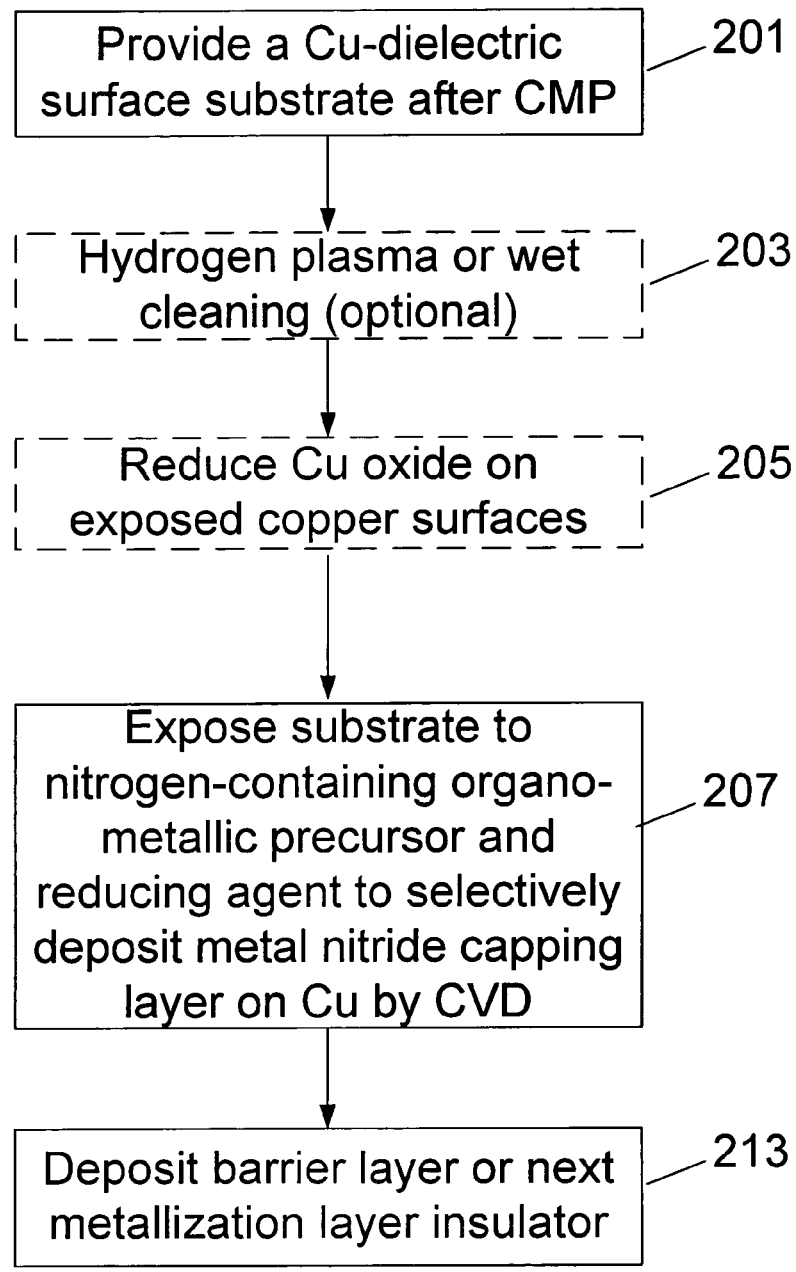
FIGS. 2A, 2B and 2C are process flow diagrams illustrating relevant operations employed in various embodiments of the present invention.
Figure 2B:
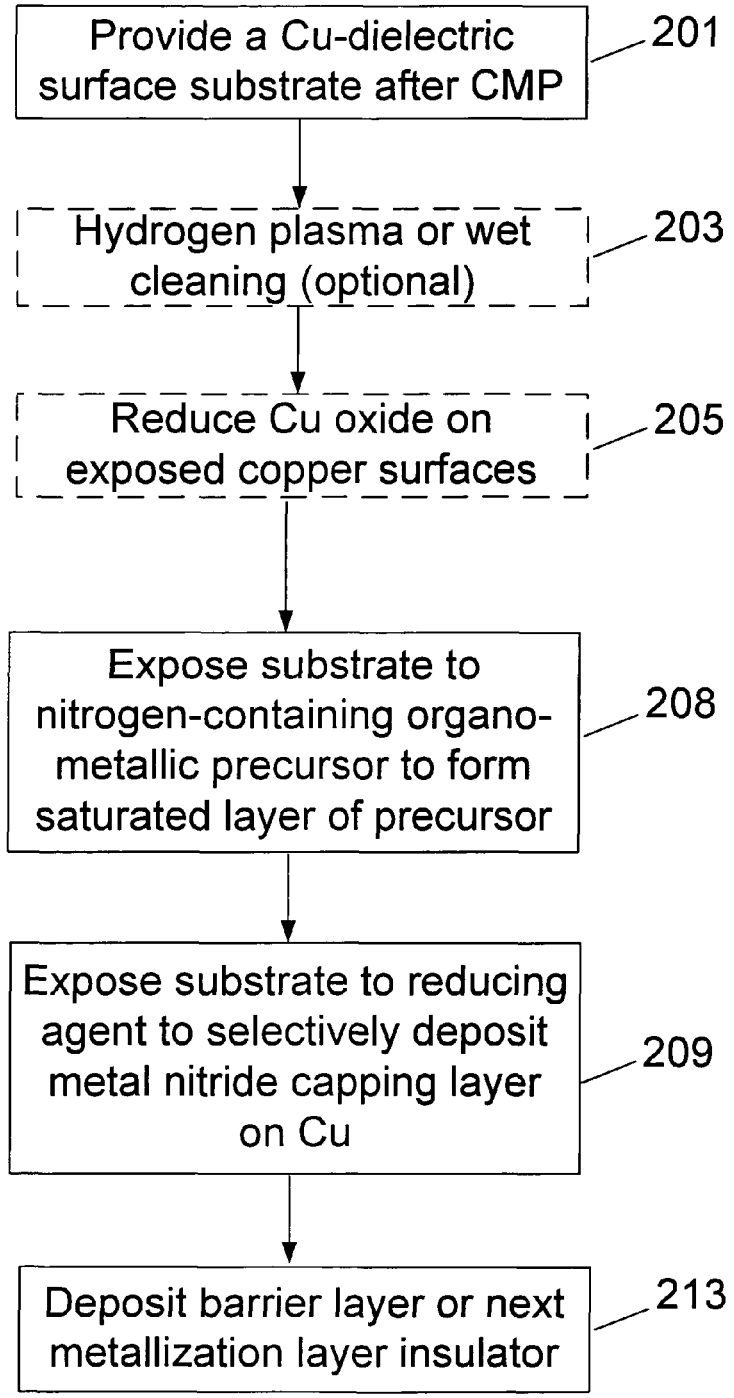

Examples of process flows for the formation of a metal nitride capping layer employed in accordance with this invention are illustrated in the flowcharts of FIGS. 2A and 2B. Turning first to FIG. 2A, a partially fabricated semiconductor device is provided 201. This device has exposed copper lines in a dielectric support. In the case of a damascene process, the copper lines are inlaid in the dielectric support after the support has had line paths and vias etched therein. Typically the partially fabricated device has a planarized surface comprised of the exposed copper lines and surrounding dielectric. Conventionally, planarization is achieved via chemical mechanical polishing (CMP). But other planarization techniques such as electropolishing or related electrolytic technique may be used. After the substrate goes through a CMP process, it may then be subjected to a wet clean and water rinse. See 203.

After the substrate is cleaned (if at all), it is often desirable to expose the surface of the Cu to a reducing agent. See 205. This is done because in the processes used to generate the device, the exposed copper lines will have some amount of copper oxide formed thereon. Reducing the exposed Cu will promote the formation of high quality adherent capping layers. This is an optional procedure for this invention. Examples of suitable reducing agents include $H_2$, $SiH_4$, $Si_2H_6$ and $B_2H_6$. As a further option, the wafer can then be cleaned using, for example, a hydrogen plasma. These operations are typically performed at temperatures of 200C or greater. It should be noted that operation 203 will remove copper oxide, however there may be additional reducing agents operations as indicated.

After performing the cleaning and reduction operations (if they are performed at all), the process selectively deposits a metal nitride layer over the copper lines by exposing the substrate to the nitrogen-containing organo-metallic precursor and reducing agent and depositing the metal nitride layer by CVD in an operation 207. After the nitride layer is formed, the process continues with formation of the next higher metallization layer with copper lines and dielectric (assuming that the previous layer was not the last layer of the device). See 213.

As indicated, FIG. 2A shows a process flow that used a CVD process to form a metal nitride layer. FIG. 2B shows a process flow in which the metal nitride layer is deposited by an ALD-type process. ALD processes form very thin layers of metal nitride (on the order of single atom thickness) during each cycle. Therefore, depending upon application, it is desirable to repeat the cycles of precursor exposure and reducing agent exposure two or more times. The exact number of cycles depends upon the desired thickness of the complete layer. For CVD of the metal nitride, exposure to the gaseous reactants is not dependent upon the formation of a saturated layer on the substrate surface and is therefore performed in one pass. That is, CVD does not involve separate reaction cycles. The metal precursors and the reducing agents are introduced to the surface substrate at the same time Turning to the ALD process of FIG. 2B, operations 201-205 and 213 are as discussed above for FIG. 2A. However, depositing the metal nitride layer involves alternately exposing the substrate to the organo-metallic precursor and reducing agent. First in an operation 208, the substrate is exposed to a nitrogen-containing organo-metallic precursor to form a saturated layer of precursor on the substrate. Then in an operation 209, the substrate is exposed to a reducing agent, forming the metal nitride layer. Operations 208 and 209, each of which may be followed by purge operations, are repeated until the desired thickness metal capping layer is deposited. In alternate embodiments, the order of operations 208 and 209 may be reversed, such that a layer of reducing agent is deposited on the substrate. Operation 209 may be a plasma-enhanced or purely thermal operation. If a plasma is used, it may be either a direct or remote plasma. Approximately 1 angstrom is typically deposited in a cycle.

Figure 3:
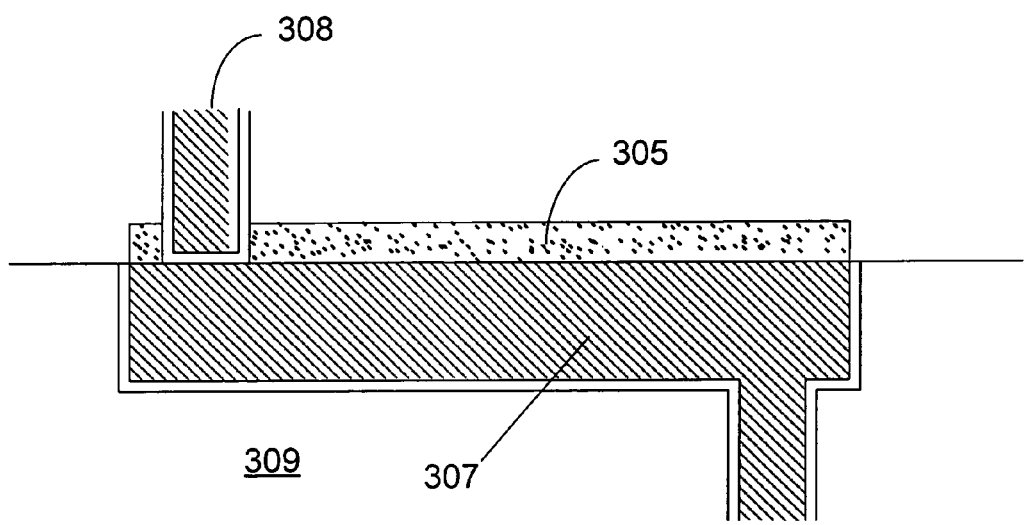
FIG. 3 is a schematic illustration of part of a damascene structure in a semiconductor device wherein the copper is capped with a metal nitride layer.

FIG. 3 illustrates a cross section of a part of a damascene device after undergoing methods described in the present invention. As shown, a Cu line 307 is embedded in an insulator 309. A metal nitride layer (305) has been selectively deposited on the Cu line. The thickness of the layers depends on the application and the technology node. For many applications, the thickness of the metal nitride layer ranges from 1-300 angstroms, e.g., 10-200 or 10-100 angstroms.

After the capping layer is deposited, typically fluorine-doped silicon dioxide is deposited over the capping layer as part of the next metallization layer. Alternatively, a silicon nitride layer can be deposited over the capping layer to further enhance the barrier properties of the capping layer. Note that the via 308 to the overlying metal layer may contact the copper conductor directly as shown, or alternatively, may contact the metal nitride if the dielectric etch used for via formation is selective to the metal nitride.

Each metallization layer may be processed as described above in the process flow of FIG. 2A or FIG. 2B. As indicated, in the embodiments described in these figures, the capping layer is a metal nitride layer. Metal nitride layers that may be selectively deposited by the methods of the present invention described in FIGS. 2A and 2B include tungsten nitride and tantalum nitride.

Figure 2C:
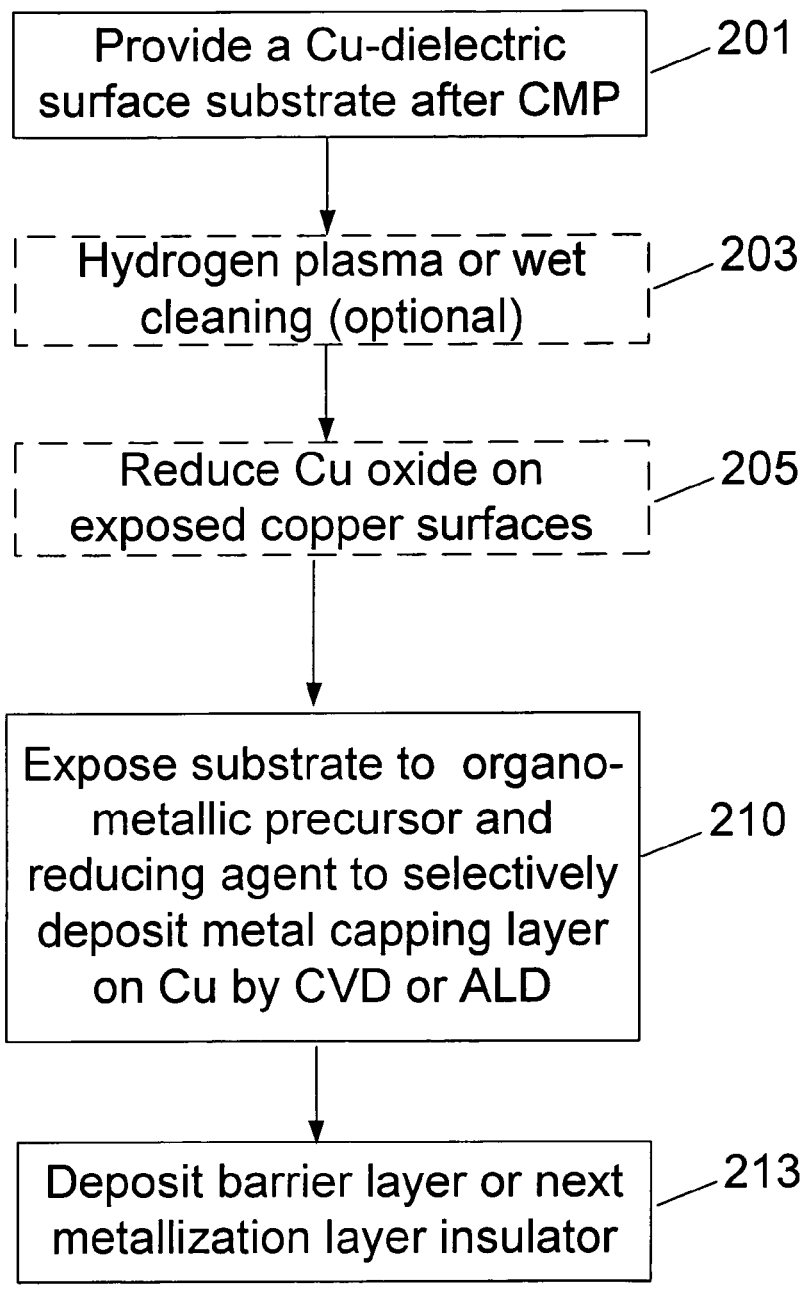

FIG. 2C shows an alternate embodiment of the present invention in which a metal layer is deposited on the substrate. Operations 201-205 and 213 are as discussed above for FIG. 2A. In an operation 210, an organo-metallic precursor and a reducing agent are introduced to deposit a metal layer on the substrate by ALD (i.e., in a process similar to that described with reference to FIG. 2B) or CVD (i.e., in a process similar to that described with reference to FIG. 2A. Metal layers that may be deposited by the process described in FIG. 2C include cobalt and ruthenium layers.

Metal/Metal Nitride Precursors and Reducing Agents

As indicated, the metal nitride capping layers of the present invention are selectively deposited on copper lines by reacting a metal nitride precursor with a reducing agent. The metal nitride precursor is typically a nitrogen-containing organo-metallic compound, e.g., an organo-metallic compound containing N-substituted amino and/or imino groups. Nitrogen in the deposited film is supplied by the metal nitride precursor. In circumstances in which a greater nitrogen concentration is desired, additional nitrogen can be supplied by using a nitrogen-containing reducing agent such as ammonia. Precursors used in the methods of the invention must be able to be selectively deposited on copper lines under using appropriate process conditions.

As indicated, $WN_x$ films may be deposited using a nitrogen-containing organo-tungsten compound. In particular embodiments, a tungsten bis(alkylimino)bis(alkylamino) compound is used to selectively deposit a $WN_x$ film. Such compounds have the following structure:

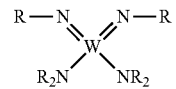

According to various embodiments, each R may be independently selected from methyl, ethyl, propyl, butyl and tert-butyl groups. These groups may be substituted or unsubstituted, though are typically unsubstituted. In a particular embodiment, the tungsten nitride precursor is bis(tert-butylimino) bis(dimethylamino) tungsten $(W[N(C_4H_9)]_2[N(CH_3)_2]_2$, which has the following structure:

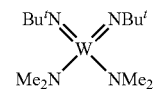

(It should be noted that these imino and amino groups are also referred to as imido and amido groups in various publications, including the certain of the following referenced publications. For the purposes of this application, imido and imino are used to refer to =NR groups and amido and amino are used to refer to —NR$_2$ groups). Non-selective deposition of tungsten nitride using bis(tert-butylimino) bis(dimethylamino) is described in the following publications: "Highly Conformal Thin Films of Tungsten Nitride Prepared by Atomic Layer Deposition from a Novel Precursor," Becker et al., *Chem. Mater.*, 2003, 15, 2969-2976 and "Diffusion barrier properties of tungsten nitride films grown by atomic layer deposition from bis(tert-butylimido)bis(dimethylamido) tungsten and ammonia," Becker et al., *Applied Physics Letters*, 2003, 82(14), 2239-2241, which are hereby incorporated by reference. Non-selective deposition of tungsten nitride using bis(tert-butylimido)bis(tert-butylamido)tungsten is described in "Kinetic and Mechanistic Studies of the Chemical Vapor Deposition of Tungsten Nitride from Bis(Tertbutylimido)Bis(Tertbutylamido) tungsten," Crane et al., *J. Phys. Chem. B* 2001, 105, 3549-3556 and "Tungsten nitride thin films prepared by MOCVD," *J. Mater. Res.*, 8(6), June 1993, 1353-1360. These references are incorporated by reference.

Suitable TaN precursors include tert-butylimino tris(diethylamino) tantalum ("TBTDET") and pentakis di-methyl amino tantalum ("PDMAT").

Any suitable reducing agent may be used, including but not limited to ammonia, a silane, e.g., SiH$_4$ or Si$_2$H$_6$, a borane, e.g., diborane, and hydrogen. In certain embodiments, ammonia is used. However, as indicated, with the tungsten precursors described above, because the nitrogen in the deposited film comes from the metal nitride precursor, the reducing agent is not limited to ammonia or other nitrogen-containing compounds. This is true for TBTDET, though with the PDMAT, only a small amount of nitrogen comes from the precursor. The rest is incorporated by the NH$_3$ co-reactant.] This may be advantageous in applications where nitrogen poisoning is a concern. In circumstances in which a greater nitrogen concentration is desired, additional nitrogen can be supplied by using a nitrogen-containing reducing agent such as ammonia. Also in ALD embodiments wherein a plasma is used, ammonia or hydrogen is typically used as the reducing agent.

As noted above, certain embodiments of the invention involve the selective deposition of cobalt or ruthenium layers. Suitable precursors for the selective deposition of cobalt on copper include bis(N,N' di-isopropyl acetamidinato) cobalt (II). Suitable precursors for the selective deposition of ruthenium include ruthenocene compounds such as (2,4-dimethylpentadienyl)(ethylcyclopentadienyl)ruthenium ("DER") and ethylcyclopentadienyl methylcyclopentadienyl ruthenium ("ethyl methyl ruthenocene"), as well as derivatives thereof. As with deposition of the metal nitride layers, any suitable reducing agent may be used, including ammonia, silane, borane, and hydrogen. In certain embodiments, an oxygen-containing reactant such as CO is used with the Ru precursors to help strip functional groups from the Ru atom.

Another advantage of using the above precursors for selective deposition is that they do not contain fluorine. Tantalum and tantalum nitride diffusion barriers (e.g., barrier 105 in FIG. 1) are susceptible to attack by fluorine. Precursors that contain fluorine have been used to deposit W layers (e.g., WF$_6$), but may lead to degradation of TaN layers.

Temperature and Other Process Conditions

Figure 4:
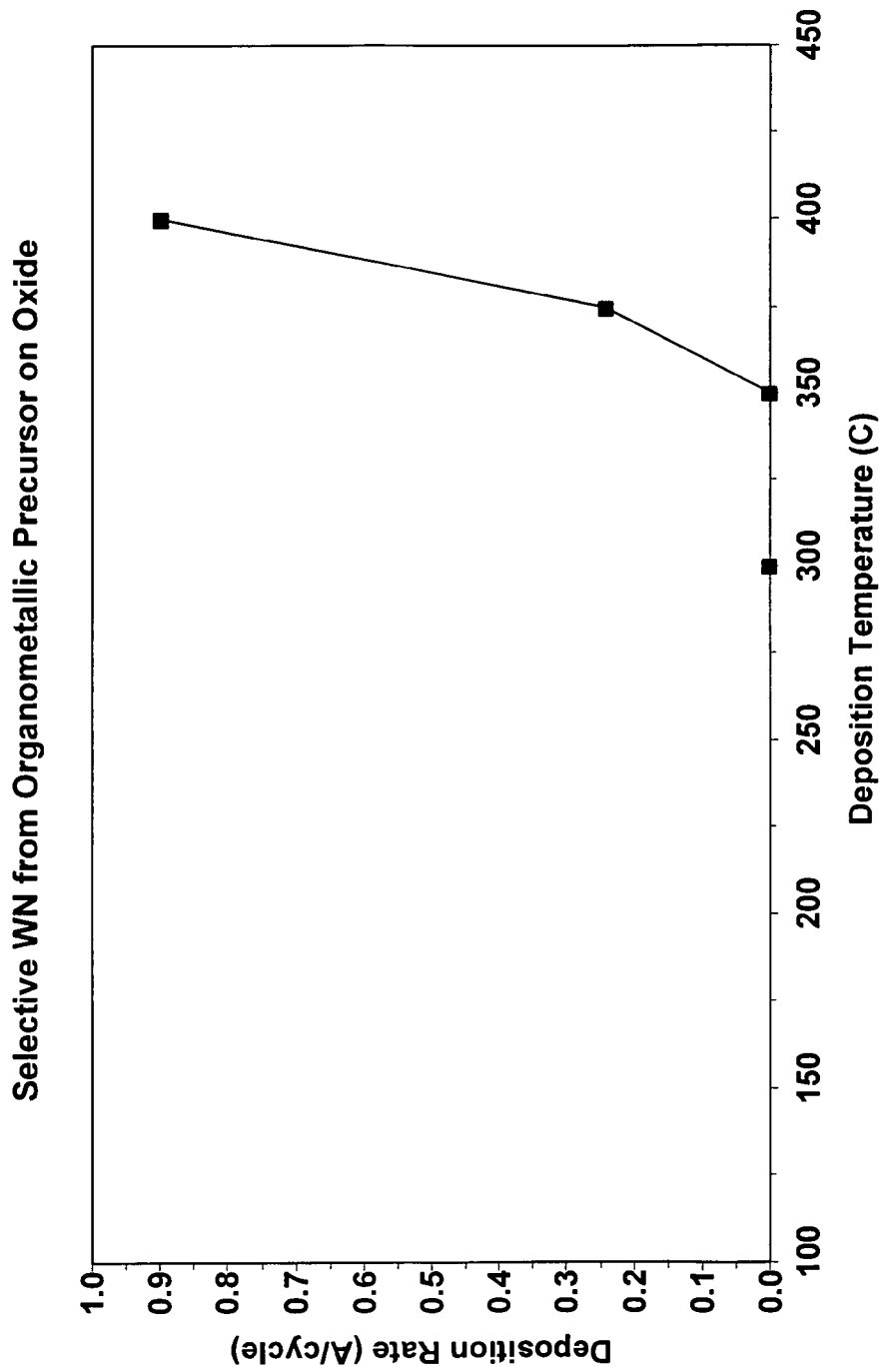
FIG. 4 is a graph showing deposition rate on dielectric as a function of deposition temperature for deposition of tungsten nitride using a nitrogen-containing organo-tungsten precursor.

Selective deposition requires using appropriate process conditions as well as use of the precursors described above. Temperature is an important process condition for selective deposition of these layers. If the temperature is too high, film will deposit on dielectric as well as on the copper lines. This is illustrated in FIG. 4, which shows deposition rate on oxide (dielectric) as a function of deposition temperature for deposition of WN$_x$. As can be seen from FIG. 4, temperatures at or below about 35° C. result in no deposition on the oxide. However, at higher temperatures deposition rate increases sharply.

The maximum temperature for which the metal nitride may be selectively deposited on copper (e.g., insignificant or no deposition on surrounding dielectric) depends on process conditions including pressure and the particular reactants used. For the deposition of WN$_x$ on oxide shown in FIG. 4, bis(tert-butylimido) bis(dimethylamido) tungsten was deposited at a pressure of 1 Torr using ammonia as a reducing agent. Suitable temperatures range from about 250-375 C, for example 300-350 C. Typical pressures range from about 0.1 Torr-10 Torr.

The films of the present invention may be deposited by ALD-type or CVD methods. ALD methods differ from CVD methods in that they are based on separate surface-controlled reactions. In ALD, the metal precursors and reducing agents are directed alternately over a substrate surface, separated by purging steps using an inert gas or other method. ALD relies on the chemisorption of a gaseous precursor to form a "saturated layer" of the metal precursor on a substrate surface. This allows for a more conformal, thin and controlled deposition compared to that formed by traditional CVD methods.

Generally, other deposition conditions depend upon the nature of the precursors/reactants, the flow rates and length of exposure to the precursor/reactants and the desired thickness of the deposition film. In this particular reactor, for an ALD process, exposure of the precursors is between about $1\times10^3$ to $1\times10^9$ Langmuirs, e.g., between about $1\times10^4$ to $1\times10^7$ Langmuirs (1 Langmuir=$1\times10^{-6}$ Torr-seconds). Exposure times are typically between about 0.1 and 10 seconds). Exemplary pressure ranges for the tungsten precursors are between about 0.1 and 10 Torr, more preferably between about 0.5 and 1 Torr. Likewise, the reducing agent exposure should be such that the agent reacts sufficiently with the saturated layer of tungsten precursor to leave tungsten metal on the substrate surface, with exposures between about $1\times10^3$ to $1\times10^9$ Langmuirs, preferably $1\times10^5$ to $1\times10^8$ Langmuirs. Temperatures and pressures for the metal precursor and reducing agent are generally similar. Purge steps are typically between about 0.1-15 seconds.

For CVD operations, suitable pressures range from about 0.1 and 50 Torr, e.g., between about 1 and 10 Torr. The flow rates of the reactants depend on the chamber volume and configuration, exposure time, desired thickness and composition of film deposition. Under typical conditions, the more preferable flow rates are between about 20 and 5000 sccm.

In certain embodiments, deposition of the metal or metal nitride layer may involve multiple sets of process conditions. For example, metal or metal nitride layer formation may involve deposition of a nucleation layer, which may be followed by bulk deposition operations. Typically, the bulk deposition process employs the same or similar precursor to that employed in the nucleation layer deposition. However, bulk deposition favors use of, a change in temperature or an increase in pressure. Deposition of a nucleation layer is described in U.S. Pat. No. 6,844,258, hereby incorporated by reference.

Figure 5:
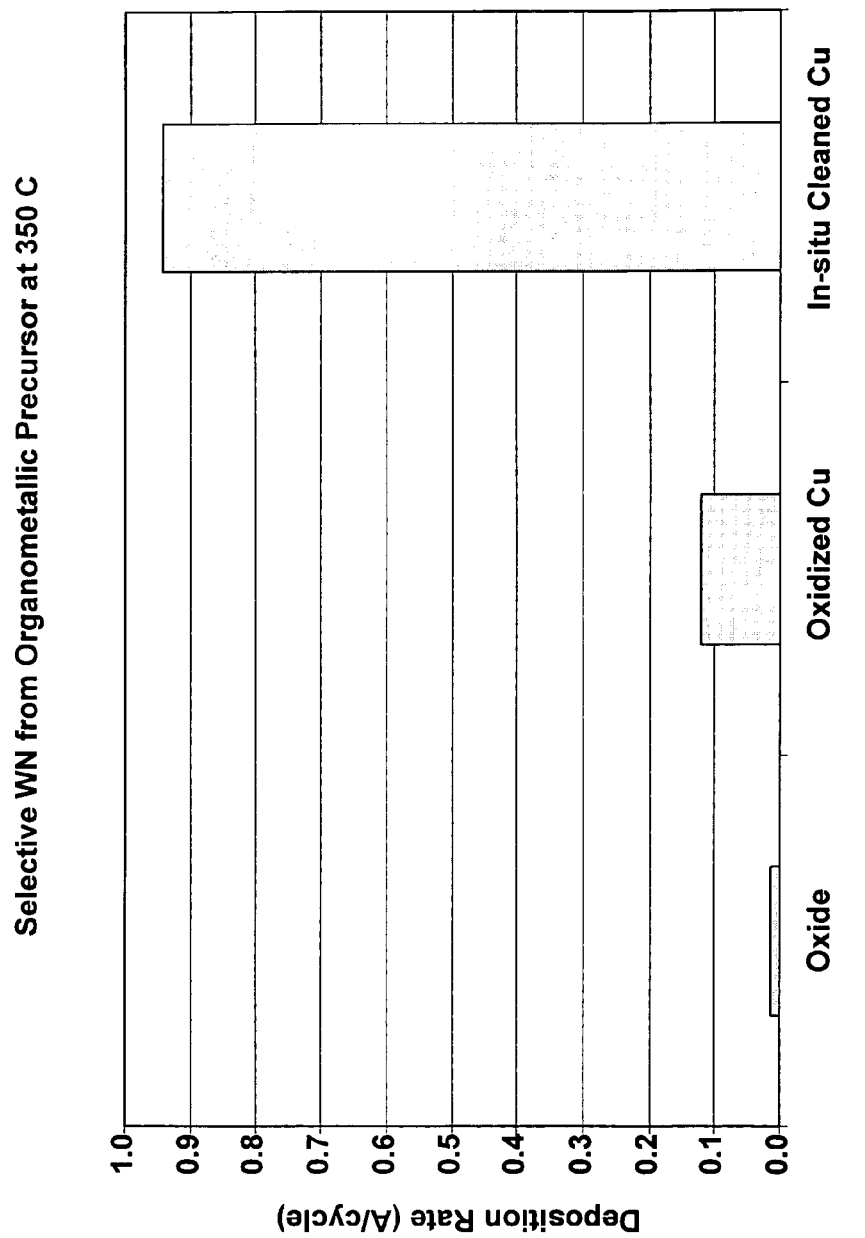
FIG. 5 shows deposition rate (angstroms/cycle) of tungsten nitride on oxide, oxidized copper and in-situ cleaned copper under selective deposition conditions.

An ALD deposition process of tungsten nitride was performed using bis(tert-butylimido) bis(dimethylamido) tungsten as a precursor and a ammonia as a reducing agent in a thermal reduction step on three surfaces: oxide (dielectric), oxidized copper and an in-situ plasma cleaned copper. 50 cycles were performed at 350 C and 1 Torr. Deposition thickness and deposition rate were measured. FIG. 5 shows deposition rate (angstroms/cycle) on each surface. Total deposition on each of the surfaces was: 0.8 angstroms on oxide, 6.1 angstroms on oxidized copper and 47.1 angstroms on the cleaned copper. As can be seen from these results and FIG. 5, the tungsten nitride film selectively deposits on the copper; a negligible amount is deposited on the dielectric. The results also show that an in-situ clean to remove copper oxide significantly enhances tungsten nitride deposition (in-situ clean copper:oxide deposition rate is about 60:1; oxidized copper: oxide is about 8:1).

Deposition Apparatus

The methods of the invention may be carried out in any number of process chambers. Examples include the Novellus Systems Concept 2 Altus chamber, the Novellus Concept 3 Altus processing chamber, the Novellus INOVA processing tool, the Novellus iALD processing chamber or any of a variety of commercially available CVD tools. In some cases, the reactor contains multiple deposition stations in which parallel reactions can take place. See, e.g., U.S. Pat. No. 6,143,082, which is incorporated herein by reference for all purposes. For example, ALD (or pulsed nucleation layer or "PNL") deposition of tungsten nitride may take place at one or more stations. After the required cycles are completed to deposit the full thickness of nitride, the substrate is moved to a different station or tool for further processing. In other embodiments, the semiconductor substrate is moved between different deposition stations during a single deposition cycle. In this approach, different stations are dedicated to different processes within the cycle. For example, one or two stations might provide reducing agent, one or two other stations might provide a tungsten (or other) precursor and still other stations might provide nitriding agent, if used. And in some embodiments, certain stations can be reserved for providing dopant precursors. The various stations can also provide for the simultaneous delivery of inert gases with the dedicated gases. Overall, tungsten nitride may be deposited by moving wafers from station to station such that the wafer is sequentially exposed to the necessary gases.

In any of these scenarios, the wafers may be indexed from one deposition station to the next to enable parallel wafer processing. Indexing continues until all substrates are coated to the desired thickness. Any number of deposition stations, each capable of having a localized atmosphere isolated from adjacent stations, is possible within the single chamber.

As will be appreciated in the art, each such deposition station will typically have a heated substrate platen for holding and heating a substrate to a predetermined temperature. In addition, each may have a backside gas distribution system to prevent deposition of the W film on the backside of the substrate, and a vacuum clamping manifold for clamping the substrate to the platen. Finally, the deposition chamber can be equipped with a transport system for transporting wafers or substrates into and out of the chamber as well as between deposition stations.

As described in U.S. Pat. No. 7,005,372, hereby incorporated by reference, a module containing one or more of the following elements for deposition of tungsten and tungsten nitride:

a plurality of deposition stations comprising a showerhead or dispersion plate for uniform gas introduction paired with a heated pedestal that holds a wafer underneath the showerhead;

a plurality of deposition stations with showerheads flush-mounted with the top of the module vacuum chamber to minimize gas re-circulation in the module and promote efficient purging between alternating deposition steps;

a fully purged top plate of the module vacuum chamber consisting of a purge gas plenum covering the top plate area not occupied by deposition showerheads wherein improved station-to-station isolation and reduced purge times between deposition cycles are obtained; or a vacuum chamber in which the heated pedestals from each deposition station are completely or partially isolated from each other by an annular pumping ring connected to the chamber exhaust. This feature further enhances station-to-station isolation and enables different processes to be run simultaneously on alternate stations in the same module.

The module may further comprise a mechanism, provided to each showerhead, for creating a RF plasma in between the showerheads and the substrate platens. Preferably, such means comprise an RF energy source, a match network, and the necessary electrical connections. In another embodiment, the module may further comprise means for creating a remote plasma in the chamber. As indicated above, a plasma may be used for the reduction operation. Some modules may provide a divert line connected directly to the process vacuum exhaust (pump or vacuum foreline) such that process gasses can bypass the deposition chamber during the time immediately after their respective mass flow controllers (MFCs) are turned on. In addition, the gas delivery system may be provided with a mechanism for controlling the line charge volume. This can be important in precisely timing delivery of the tungsten precursor and/or reducing agent. With such hardware features, all gases that pulse on and off during deposition can be delivered with a divert and line charge process sequence.

Figure 6:
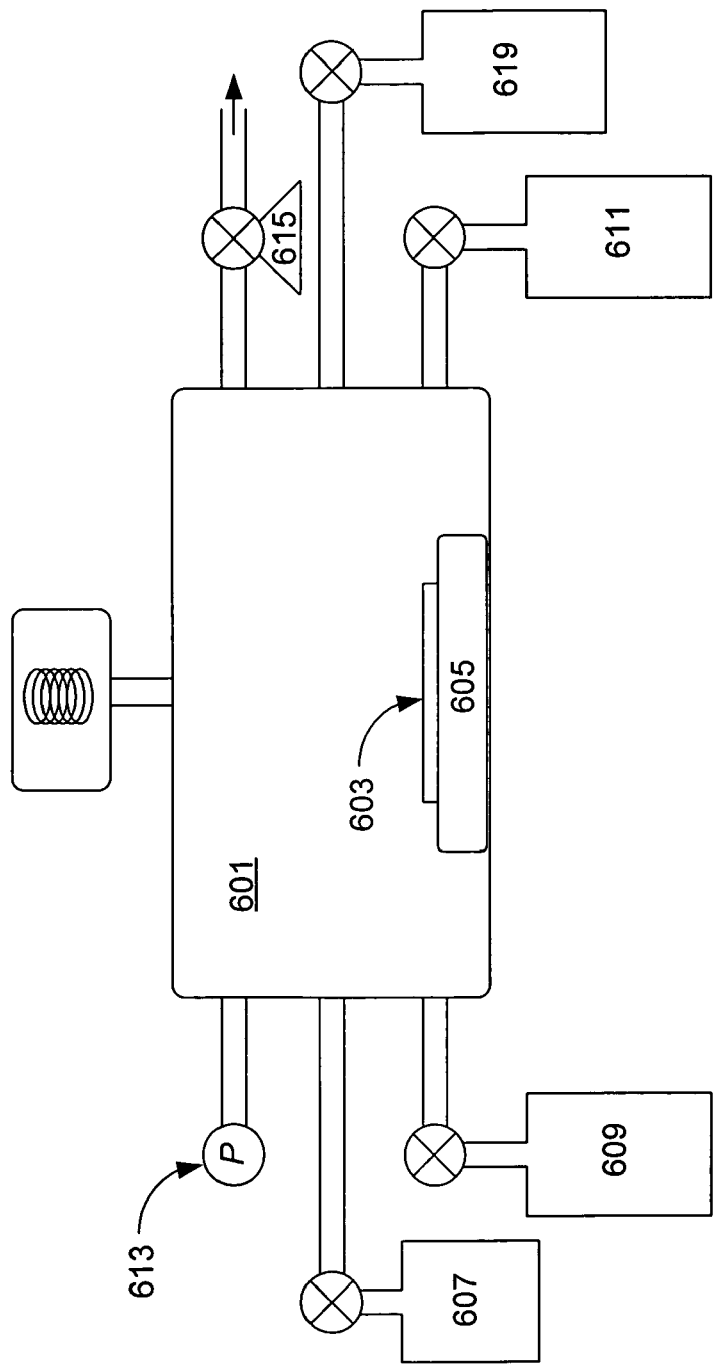
FIG. 6 is a schematic diagram showing the basic features of an apparatus suitable for practicing the current invention.

FIG. 6 is a simple schematic of an apparatus in which the processes in the present invention take place. The semiconductor wafer 603 is placed on top of a supporting pedestal 605 in a reaction chamber 601. The supporting pedestal 605 has a thermocouple or other temperature-sensing device attached to monitor the temperature of the wafer. The temperature of the wafer can be heated by any number commonly known methods, such as a resistive heating element. A pressure gauge 613 monitors the pressure inside the chamber during operation. The metal or metal nitride precursor 607 and reducing agent 609 are introduced in a controlled manner using valves. A neutral gas source 611, may provide a neutral gas such as argon gas to increase chamber pressure and reactant concentration control. A plasma generator source 617 allows for the introduction of a plasma if necessary as described previously. A pump with valve 615 is used to evacuate the chamber of reactant by products and unused reactants between cycles of sample exposure to reactant gases.

Although various details of the apparatus have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. A method of forming a capping layer on copper lines of a semiconductor device, the method comprising:
    (a) providing a partially fabricated semiconductor device comprising exposed surfaces of the copper lines and surrounding dielectric to a reactor;
    (b) introducing a vapor phase nitrogen-containing organo-metallic precursor and a reducing agent to the reactor; and
    (c) exposing the partially fabricated semiconductor device to the organo-metallic precursor and reducing agent under conditions such that a metal nitride film is selectively deposited on the exposed copper lines.

2. The method of claim 1 wherein the organo-metallic precursor and reducing agent are introduced alternately over the substrate to deposit the metal nitride by atomic layer deposition (ALD).

3. The method of claim 2 wherein introducing the reducing agent comprises exposing the agent to a plasma, wherein the plasma is within the deposition chamber or located remotely from the deposition chamber.

4. The method of claim 1, wherein the metal nitride film is deposited by chemical vapor deposition (CVD).

5. The method of claim 1 wherein the precursor is an organo-metallic compound comprising N-substituted amino and imino groups.

6. The method of claim 1 wherein the organo-metallic precursor is an organo-tungsten precursor and the metal nitride film is a tungsten nitride film.

7. The method of claim 6 wherein the organo-tungsten precursor has the structure:

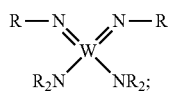

wherein each R group is independently selected from methyl, ethyl, propyl, butyl and tert-butyl.

8. The method of claim 6 wherein the organo-tungsten precursor has the following structure:

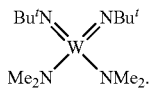

9. The method of claim 1 wherein the reducing agent is selected from a silane, a borane, ammonia and hydrogen.

10. The method of claim 1 wherein the organo-metallic precursor is an organo-tantalum precursor and the metal nitride film is a tantalum nitride film.

11. The method of claim 10 wherein the precursor is selected from tert-butylimino tris(diethylamino) tantalum ("TBTDET") and pentakis di-methyl amino tantalum ("PDMAT").

12. The method of claim 1 further comprising depositing a silicon-containing capping layer over the metal nitride.

13. The method of claim 1, wherein the copper surface is cleaned by an in-situ hydrogen plasma, in-situ dry cleaning or by wet cleaning before depositing the metal nitride.

14. The method of claim 1, wherein the metal nitride layer is between about 3 angstroms and 100 angstroms thick.

15. The method of claim 1, wherein the copper surface is exposed to an in-situ hydrogen plasma before depositing the metal nitride film.

16. A method of forming a capping layer on copper lines of a semiconductor device, the method comprising:
providing a partially fabricated semiconductor device comprising exposed surfaces of the copper lines and surrounding dielectric to a reactor;
exposing the exposed surfaces of the copper lines to a hydrogen plasma;
introducing a vapor phase nitrogen-containing organo-metallic precursor and a reducing agent to the reactor; and
exposing the partially fabricated semiconductor device to the organo-metallic precursor and reducing agent under conditions such that a metal nitride film is selectively deposited on the exposed copper lines.

* * * * *